US009017932B2

(12) United States Patent (10) Patent No.: US 9,017,932 B2
Imai et al. (45) Date of Patent: Apr. 28, 2015

(54) PROCESSED SUBSTRATE AND METHOD FOR MANUFACTURING SAME

(71) Applicant: Tokyo Ohka Kogyo Co., Ltd., Kanagawa (JP)

(72) Inventors: Hirofumi Imai, Kawasaki (JP); Koki Tamura, Kawasaki (JP); Koichi Misumi, Kawasaki (JP); Takahiro Asai, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 14/046,308

(22) Filed: Oct. 4, 2013

(65) Prior Publication Data

US 2014/0038111 A1 Feb. 6, 2014

Related U.S. Application Data

(62) Division of application No. 12/638,082, filed on Dec. 15, 2009, now abandoned.

(30) Foreign Application Priority Data

Dec. 19, 2008 (JP) .................................. 2008-323832
Sep. 17, 2009 (JP) .................................. 2009-215782

(51) Int. Cl.
*G03F 7/095* (2006.01)
*G03F 7/20* (2006.01)
*H01L 21/683* (2006.01)

(52) U.S. Cl.
CPC ............ *G03F 7/20* (2013.01); *Y10T 428/24273* (2015.01); *H01L 21/6836* (2013.01); *H01L 2221/6834* (2013.01)

(58) Field of Classification Search
CPC ... G03F 7/0957; G03F 7/30; H01L 21/76802; H01L 21/58
See application file for complete search history.

(56) References Cited

U.S. PATENT DOCUMENTS 6,492,195 B2  12/2002  Nakanishi et al.
7,217,448 B2   5/2007  Koyo et al.
2001/0005043 A1  6/2001  Nakanishi et al.
2002/0083588 A1*  7/2002  Kimura .................... 29/890.1
2006/0102290 A1  5/2006  Harada et al.
2006/0222813 A1  10/2006  Kato et al.
2007/0062644 A1  3/2007  Nakamura et al.
2007/0151674 A1  7/2007  Miyanari
2009/0013724 A1  1/2009  Koyo et al.
2009/0197070 A1  8/2009  Miyanari
2009/0288780 A1  11/2009  Nakamura et al.
2011/0146899 A1  6/2011  Nakamura et al.

FOREIGN PATENT DOCUMENTS

| JP | 10-163136 | 6/1998 |
| JP | 2000-061667 | 2/2000 |
| JP | 2001-105398 | 4/2001 |
| JP | 2001-185519 | 7/2001 |
| JP | 2003-307645 | 10/2003 |
| JP | 2004-351494 | 12/2004 |
| JP | 2006-54072 | 2/2006 |
| JP | 2007-67167 | 3/2007 |
| JP | 2008-299208 | 12/2008 |
| WO | 2005/034594 | 4/2005 |
| WO | 2007/096958 | 8/2007 |
| WO | 2008/081561 | 7/2008 |

OTHER PUBLICATIONS

U.S. Office Action issued Aug. 7, 2012 in corresponding U.S. Appl. No. 12/638,082.
U.S. Office Action issued Oct. 26, 2012 in corresponding U.S. Appl. No. 12/638,082.
U.S. Office Action issued Apr. 9, 2013 in corresponding U.S. Appl. No. 12/638,082.
U.S. Office Action issued Jul. 8, 2013 in corresponding U.S. Appl. No. 12/638,082.
Translation of WO/JP 2005/034594 A1, Apr. 2005.

* cited by examiner

*Primary Examiner* — Daborah Chacko Davis
(74) *Attorney, Agent, or Firm* — Wenderoth, Lind & Ponack, L.L.P.

(57) ABSTRACT

A processed substrate and a method for easily manufacturing the processed substrate with high efficiency are provided, the processed substrate having openings in respective surfaces thereof that are matched to each other in size. The processed substrate includes a light transmissive substrate having a plurality of through-holes. Each of the through-holes has a large-diameter opening and a small-diameter opening, the large-diameter opening being larger in size than the small-diameter opening by 5% or less of the size of the large-diameter opening. As such, through-holes with openings in the respective surfaces of the processed substrate that are matched to each other in size can be provided.

19 Claims, 4 Drawing Sheets

PROCESSED SUBSTRATE AND METHOD FOR MANUFACTURING SAME This application is a divisional of application Ser. No. 12/638,082, filed Dec. 15, 2009.

This Nonprovisional application claims priority under 35 U.S.C. §119(a) on Patent Application No. 2008-323832 filed in Japan on Dec. 19, 2008 and Patent Application No. 2009-215782 filed on Sep. 17, 2009, the entire contents of which are hereby incorporated by reference.

BACKGROUND OF THE INVENTION

1. Technical Field

The present invention relates to (i) a processed substrate which can be used as, for example, a support plate and (ii) a method for manufacturing the processed substrate.

2. Description of the Related Art

It has been desired that a semiconductor chip be processed with microfabrication so that an improvement in each of multifunctionalization of a system, clock frequency, and high-density integration can be further advanced.

Downsizing of the semiconductor chip can be realized by, for example, thinning a wafer which serves as a substrate. However, a thinned wafer noticeably deteriorates in strength, and may have a defect (crack or breakage) due to a subtle contact or heat stress that occurs while the thinned wafer is handled. Thus, the thinned wafer is provided with a processed substrate which is used as, for example, a support plate, such that the thinned wafer is improved in strength while being processed.

Japanese Patent Application Publication, Tokukai, No. 2001-185519 discloses the following invention, which is directed to a technique for a processed substrate. A support substrate (processed substrate) disclosed in JP 2001-185519 includes (i) a support plate having through-holes and (ii) a support plate having no through-hole, and the support plates are combined with each other so as to constitute a two-layer structure. According to the teachings of JP 2001-185519, in a case where the support substrate having the above configuration is used, it is possible to easily remove the support substrate from a wafer after the wafer has been processed.

SUMMARY OF THE INVENTION

1. Technical Problem

It is required to attach the processed substrate temporarily to the wafer via an adhesive agent or the like material and then to remove the processed substrate therefrom by use of a removal liquid. Therefore, through-holes are formed in the processed substrate, each of the through-holes has one opening via which the removal liquid is introduced, and another opening which makes contact with the wafer. Thus, the removal liquid can easily reach the adhesive agent applied between the wafer and the processed substrate.

An example of a method for forming the through-hole in the processed substrate encompasses a method which includes (i) forming a layer made by a photosensitive resin onto each surface of a substrate serving as a base material, (ii) performing pattern irradiation of a pattern onto one surface of the substrate by exposing it to light, and then forming, by development, the pattern into the layer on the one surface of the substrate, (iii) forming a hole to approximately a middle of the substrate by performing etching to the one surface of the substrate based on the pattern thus formed, and (iv) forming a pattern in the layer on the other surface of the substrate, and performing etching to the other surface of the substrate, based on a pattern thus formed. According to the method, before the pattern irradiation is carried out onto the other surface of the substrate, pattern alignment should be carried out based on the pattern of the hole having been formed in the one surface of the substrate, in such a manner that holes that are formed in the respective surfaces of the substrates will constitute a through-hole having a single aligned central axis. However, because the processed substrate, which will be used in combination with the downsized wafer, is as much downsized as the downsized wafer, the through-hole to be formed in the substrate is very fine. Therefore, when the hole is formed in the other surface (opposing surface of the one surface of the substrate in which the hole has been formed) of the substrate, it is very difficult that the pattern adjustment be carried out based on the pattern of the hole having been formed in the one surface of the substrate. As such, it is more likely that an opening of the hole formed in the other surface of the processed substrate has a central axis which is misaligned relative to a central axis of an opening of the hole formed in the one surface of the processed substrate. Such misalignment of the central axis may result in a crack (breaking, chipping).

For prevention of this, there is a method whereby a through-hole having a single aligned central axis is formed. The method includes: (i) providing a substrate which is a light transmissive substrate, and (ii) performing exposure of photosensitive resin layers that are formed on respective surfaces of the substrate, in such a manner that the photosensitive resin layers on the respective surfaces of the substrate are exposed to light at one time by irradiating one surface of the substrate with the light which then passes through to the other surface of the substrate. By the method, it is possible to form the through-hole having the single aligned central axis.

However, in a case where the exposure of the photosensitive resin layers is carried out in the above way, the photosensitive resin layer on the one surface of the substrate, which is directly irradiated with the light, is exposed with an amount of the light different from an amount of the light with which the photosensitive resin layer on the other surface of the substrate, which is irradiated with the light having passed through to the other surface of the substrate, is irradiated. As such, even if the photosensitive resin layers on the respective surfaces of the substrate are made from the same photosensitive resin compositions, it is difficult to ensure that the photosensitive resin layers on the respective surfaces of the substrate have the same responses to the exposure. This results in a problem in that the patterns formed in the photosensitive resin layers on the respective surfaces of the substrate differ from each other in size. If the patterns formed in the photosensitive resin layers on the respective surfaces of the substrate differ from each other in size, the though-hole, which is subsequently formed by boring the holes in the respective surfaces of the substrate based on the patterns formed in the photosensitive resin layers, has openings in the respective surfaces of the substrate which are different from each other in size. The processed substrate is the substrate being downsized, and the through-hole that is formed in the substrate is also very fine. Therefore, if the through-hole is formed by the holes in the respective surfaces of the substrate which are different from each other in size of openings, it is impossible for the through-hole to have a good shape. This may result in a crack, which may then lead to deterioration in strength of the substrate itself. However, JP 2001-185519 discloses nothing as to a method which solves such a problem which occurs while holes are formed in a support plate.

The present invention is made in view of the above-described problem, and an object of the present invention is to provide (i) a processed substrate having a through-hole whose openings on respective surfaces of the processed substrate have sizes matched to each other, and (ii) a method for easily manufacturing the processed substrate at high efficiency.

2. Solution to the Problem

A processed substrate of the present invention is a processed substrate including a light transmissive substrate having a plurality of through-holes each having a larger opening diameter and a smaller opening diameter, where the larger opening diameter is larger in size than the smaller opening diameter by a difference of 5% or less of a size of the larger opening diameter.

A method of the present invention for manufacturing a processed substrate is a method for manufacturing a processed substrate including a light transmissive substrate having a plurality of through-holes, the method including:

(i) forming a pattern in each of photosensitive resin layers on respective surfaces of the light transmissive substrate by exposing the each of photosensitive resin layers to light, which pattern corresponds to a pattern of the plurality of through-holes; and (ii) forming the plurality of through-holes, based on the pattern formed in the each of photosensitive resin layers by the step (i), the step (i) including exposing the each of photosensitive resin layers on respective surfaces of the light transmissive substrate to light, by irradiating one of the respective surfaces of the light transmissive substrate with the light which then passes through to the other one of respective surfaces of the light transmissive substrate, wherein the photosensitive resin layer that is formed on the one of the respective surfaces of the light transmissive substrate has a thickness of 20 mm or thicker but not thicker than 200 mm, and the other of photosensitive resin layers which is formed on the other one of the respective surfaces of the light transmissive substrate has a thickness of 40% or greater but not greater than 70% of the thickness of the photosensitive resin layer formed on the one of the respective surfaces of the light transmissive substrate.

Further, a method of the present invention for manufacturing the processed substrate is a method for manufacturing a processed substrate including a light transmissive substrate having a plurality of through-holes, the method including:

(i) forming a pattern in each of photosensitive resin layers formed on respective surfaces of the light transmissive substrate, by exposing the each of photosensitive resin layers to light, which pattern corresponds to a pattern of the plurality of through-holes; and (ii) forming the plurality of through-holes, based on the pattern formed in the each of photosensitive resin layers by the step (i), wherein the step (i) includes: irradiating one of the respective surfaces of the light transmissive substrate with light which then passes through to the other one of the respective surfaces of the light transmissive substrate; and reflecting, back to the other one of the respective surfaces of the light transmissive substrate, the light which has now passed through the other one of the respective surfaces of the light transmissive substrate, so that the other one of the respective surfaces of the light transmissive substrate is irradiated with the light thus reflected.

3. Advantageous Effects of Invention

A processed substrate of the present invention has a through-hole which a larger opening diameter and a smaller opening diameter, wherein the larger opening diameter is greater in size than the smaller opening diameter by a difference of 5% or less of a size of the larger opening diameter. Therefore, the processed substrate has a through-hole whose openings on respective surfaces of the processed substrate are matched to each other in size.

By the method of the present invention, (i) the photosensitive resin layers formed on the respective surfaces of the light transmissive substrate are exposed to light by irradiating one of the respective surfaces of the light transmissive substrate with the light which then passes through to the other one of the surfaces of the light transmissive substrate, and (ii) that of the photosensitive resin layers which is formed on the one of the respective surfaces of the light transmissive substrate has the film thickness of 20 μm or thicker but 200 μm or thinner, and the other of the photosensitive resin layers which is formed on the other one of the respective surfaces of the light transmissive substrate has the film thickness of 40% or greater but not greater than 70% of the film thickness of that of the photosensitive resin layer which is formed on the one of the respective surfaces of the light transmissive substrate. Therefore, the photosensitive resin layers formed on the respective surfaces of the substrate can have approximately the same photosensitivities to exposure. As such, sizes of the pattern to be formed in each of the photosensitive resin layers on the respective surfaces of the substrate can be matched between each surface. This makes it possible to easily form, with high efficiency, a through-hole whose openings on the respective surfaces are matched to each other in size.

Further, by the method of the present invention, the photosensitive resin layers formed on the respective surfaces of the substrate are exposed to light at one time by (i) irradiating one of the respective surfaces of the light transmissive substrate with the light which then passes through to the other one of the respective surfaces of the light transmissive substrate, and (ii) reflecting, back to the other one of the respective surfaces of the light transmissive substrate, the light which has now passed through the other one of the respective surfaces of the light transmissive substrate, so that the other one of the respective surfaces of the light transmissive substrate is irradiated with the light thus reflected. Therefore, it is possible to perform exposure in such a manner that both of the photosensitive resin layers are irradiated with more equal amounts of light. Thus, it is possible that sizes of the pattern formed on each surface of the light transmissive substrate can be matched between each surface. Therefore, it is possible to easily form, with high efficiency, a through-hole whose openings on the respective surfaces of the light transmissive substrate are matched to each other in size.

For a fuller understanding of the nature and advantages of the invention, reference should be made to the ensuing detailed description taken in conjunction with the accompanying drawings.

DETAILED DESCRIPTION OF THE INVENTION

<1. Processed Substrate of Present Invention>

Figure 1:
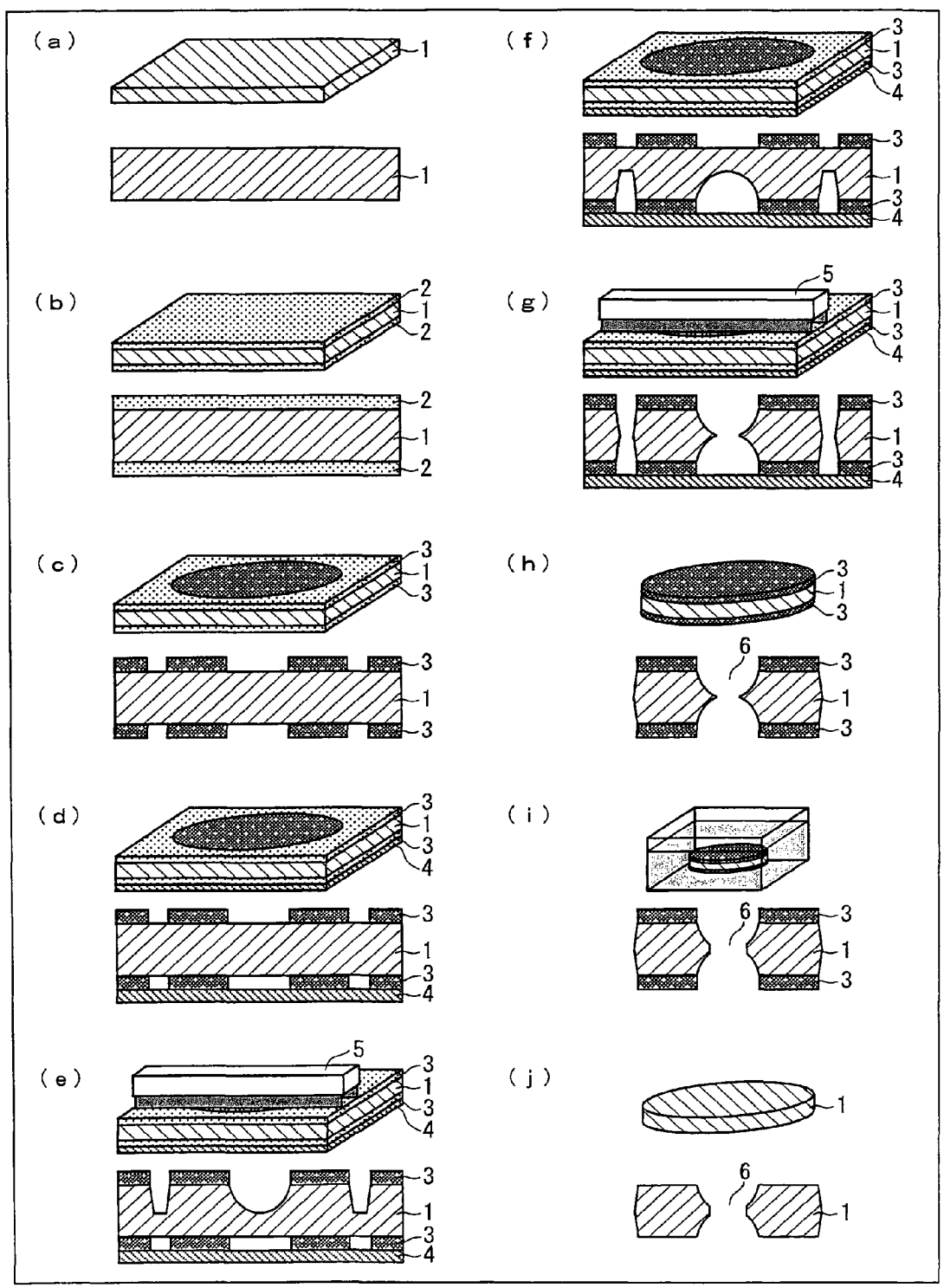
FIG. 1 is a view schematically showing steps of a manufacturing method for a processed substrate in accordance with one embodiment of the present invention.

A processed substrate of the present invention is a processed substrate including a light transmissive substrate having a plurality of through-holes each having a larger opening diameter and a smaller opening diameter, wherein the larger opening diameter should be greater in size than the smaller opening diameter by a difference of 5% or less of a size of the larger opening diameter.

In the present invention, the processed substrate is a substrate having been processed in such a manner that a plurality of through-holes is formed therein, and the processed substrate may be simply referred to as a "substrate" hereinafter. For example, the processed substrate of the present invention can be used as a support substrate (support plate) for supporting a wafer during processing (such as grinding or the like) of the wafer.

The substrate is not particularly limited in material, but may be made from a light transmissive material such as, for example, glass, quartz, sapphire, ceramics, or the like. Such a substrate as made from a light transmissive material allows light to pass through from one surface of the substrate to the other surface of the substrate when, for example, the one surface of the substrate is irradiated with light. Therefore, it is possible to expose photosensitive resin layers formed in respective surfaces of the substrate to light at one time. The substrate is not particularly limited in shape either. In a case where the substrate is used as a support plate of the wafer, the substrate may be formed in a shape capable of supporting the wafer.

The through-holes are holes each penetrating through the substrate.

The through-holes, which may be holes penetrating though the substrate, can be formed in an hourglass shape or a columnar shape, for example. Each of the through-holes may be formed by conically boring the substrate from each of respective surfaces of the substrate to a point where conically bored holes are in communication with each other in the substrate.

A through-hole has openings in respective surfaces of the substrate. The openings of the through-hole are not particularly limited in shape, but are preferably formed in circular shapes. Additionally, in a case where the through-hole has the openings formed in the circular shapes, it is preferable that the openings of the through-hole have diameters each ranging from, for example, 10 μm to 10000 μm, and it is more preferable that the openings of the through-hole have diameters each ranging from 100 μm to 500 μm. The openings with the diameters in the above range allow a suitable flow of a removal liquid through the through-hole in the substrate.

In the present specification, of the diameters of the respective openings of a through-hole in the surfaces, a larger one of the diameters is referred to as a "larger opening diameter", and a smaller one of the diameters is referred to as a "smaller opening diameter".

An opening diameter can be a diameter of an opening, a width thereof, or an alternative which indicates a size of the opening. The opening diameter can be chosen from the above as appropriate in accordance with a shape of the opening. For example, in a case where the opening has a circular shape, the opening diameter can be a diameter of the opening.

In the through-hole formed in the processed substrate of the present invention, one of the opening diameters is greater in diameter than the other one of the opening diameters by a difference of preferably 5% or less of the larger one of the opening diameters, more preferably 3.5% or less of the larger one of the opening diameters, and most preferably 0. If the difference between the opening diameters is greater than 5%, (i) the substrate will deteriorate in strength, and (ii) a dissolution time in a removal step, which is carried out in a case where the processed substrate is used as a wafer handing support, will be longer. Longer dissolution time requires that each surface of the processed substrate be processed individually. On the other hand, in the above-described configuration, the opening diameters in the respective surfaces of the substrate are matched between each surface. As such, the through-hole can be good in shape, and the processed substrate can be improved in strength. With the above-described configuration, furthermore, it is possible to prevent the dissolution time in the removal step from becoming longer, such that a negative effect on reaching of the removal liquid to an adhesive agent can be prevented.

The through-hole is not particularly limited in depth, either. For example, a depth of the through-hole can range from 100 to 10000 μm. The number of through-holes formed in a processed substrate can range from, for example, 1 to 1000 holes/cm$^2$, but is not limited to this range. The number of the through-holes formed in the processed substrate preferably ranges from 10 to 600 holes/cm$^2$, and more preferably ranges from 50 to 300 holes/cm$^2$.

<2. Method 1 for Manufacturing Processed substrate>

A method of the present invention for manufacturing a processed substrate (hereinafter referred to as "method 1 of the present invention") is a method for manufacturing a processed substrate including a light transmissive substrate having a plurality of through-holes, the method including:

(i) forming a pattern in each of photosensitive resin layers on respective surfaces of the light transmissive substrate by exposing the each of photosensitive resin layers to light, which pattern corresponds to a pattern of the plurality of through-holes; and (ii) forming the plurality of through-holes, based on the pattern formed in the each of photosensitive resin layers by the step (i), the step (i) including exposing the each of photosensitive resin layers on respective surfaces of the light transmissive substrate to light, by irradiating one of the respective surfaces of the light transmissive substrate with the light which then passes through to the other one of respective surfaces of the light transmissive substrate, wherein that of photosensitive resin layers which is formed on the one of the respective surfaces of the light transmissive substrate has a thickness of 20 μm or thicker but not thicker than 200 μm, and the other of photosensitive resin layers which is formed on the other one of the respective surfaces of the light transmissive substrate has a thickness of 40% or greater but not greater than 70% of the thickness of that of photosensitive resin layers which is formed on the one of the respective surfaces of the light transmissive substrate. With reference to FIG. 1, the following explains a method for manufacturing the processed substrate in accordance with one embodiment of the present invention. Note however that the present invention is not limited to this embodiment. FIG. 1 is a view schematically showing steps of the method for manufacturing the substrate in accordance with the embodiment of the present invention.

First, as shown in (a) of FIG. 1, a substrate 1 which is made from a material, as described earlier, is provided as a base material for a processed substrate 1 of the present embodiment. The substrate 1 made from the material has a light transmittance.

Then, as shown in (b) of FIG. 1, a photosensitive resin layer 2 is formed from a photosensitive resin composition on each surface of the substrate 1. In a case where the photosensitive resin composition is a liquid, a method such as a spin coating method or a dye coating method can be adopted so as to form the photosensitive resin layer 2. On the other hand, in a case where the photosensitive resin composition is a dry film, a method such as a laminating method can be adopted so as to form the photosensitive resin layer 2.

In the present embodiment, the photosensitive resin layer 2 formed on each surface of the substrate 1 should have a thickness of 20 μm or thicker but 200 μm or thinner. It is more preferable that the photosensitive resin layer 2 have a thickness of 50 μm or thicker but 150 μm or thinner. The photosensitive resin layer 2 having a thickness of 20 μm or thicker can have strength resistible even in a case where, for example, sandblasting is carried out in the following pattern formation step. On the other hand, the photosensitive resin layer 2 having a thickness of 200 μm or thinner can have a further improved sensitivity to light which is exposed in the following pattern formation step. In the present specification, for the sake of easy explanation, a surface which is irradiated with light during the following pattern formation step is referred to as a "front irradiation surface", and an opposing surface of the front irradiation surface is referred to as a "back surface".

The photosensitive resin layer 2 formed on the back surface of the substrate 1 should have a thickness of 40% or greater but 70% or less than the thickness of the photosensitive resin layer 2 formed on the front surface of the substrate 1. It is more preferable that the photosensitive resin layer 2 have a thickness of 50% or greater but 60% or less of the thickness of the photosensitive resin layer formed on the front surface of the substrate 1. In a case where the photosensitive resin layer 2 formed on the back surface of the substrate 1 has a thickness of 40% or greater of the thickness of the photosensitive resin layer formed on the front surface of the substrate 1, the photosensitive resin layer 2 formed on the back surface of the substrate can have a strength that is resistible to the boring step to be carried out subsequently. The pattern formation step which is carried out subsequently exposes the photosensitive resin layers 2 with light at one time, by irradiating the front irradiation surface of the substrate 1 with the light, which then passes through to the back surface of the substrate 1. However, the light passing through to the back surface of the substrate 1 is weaker in intensity than the light with which the front surface of the substrate 1 has been irradiated. This results in a difference between sizes of the patterns formed in the photosensitive resin layers 2 on the respective surfaces. In order to solve this, the photosensitive resin layer 2 formed on the back surface of the substrate 1 should have a thickness which is 70% of less of the thickness of the photosensitive resin layer 2 formed on the front irradiation surface. This can cause the photosensitive resin layer 2 formed on the back surface of the substrate 1 to be further improved in sensitivity to the light applied in the pattern formation step.

In a case where the photosensitive resin layers 2 are formed in the above way, it is easier that the subsequent pattern formation step forms, by exposing both the photosensitive resin layers 2 formed on the respective surfaces at one time, a pattern whose sizes on the respective surfaces are matched to each other. As such, it is possible to form a good through-hole 6 whose openings on the respective surfaces are matched to each other in size. The photosensitive resin composition for forming the photosensitive resin layers 2 can be a resin such as, for example, a cellulose-based resin, an acrylic-based resin, or a resin having a urethane bond. Particularly, it is preferable that the photosensitive resin composition include the resin having a urethane bond. For example, a photosensitive resin made of the resin having a urethane bond gives an improved resistance to sandblasting which is carried out so as to form through-holes 6. The photosensitive resin composition for forming the photosensitive resin layers 2 on the respective surfaces of the substrate is not particularly limited. Thus, the same photosensitive resin composition can be used so as to form each of the photosensitive resin layers on the surfaces of the substrate. It is assumed that each of the photosensitive resin layers 2 in the respective surfaces of the substrate is made from the same photosensitive resin composition. Based on this assumption, if film thicknesses of the respective photosensitive resin layers 2 are set to the film thickness described earlier, it can be easier to give one size to each pattern to be formed on the photosensitive resin layers.

Then, as shown in (c) of FIG. 1, the pattern formation step is carried out.

It is preferable that the pattern formation step perform exposure of the photosensitive resin layers 2 by irradiating the photosensitive resin layer 2 on the front irradiation surface of the substrate 1 with light, via, for example, a mask having a pattern corresponding to a pattern of the through-holes 6 to be formed in the substrate 1 or the like. The substrate 1, which is light transmissive, allows the light to pass through to the back surface of the substrate 1. Therefore, it is possible to expose the photosensitive resin layers 2 on the respective surface of the substrate 1 to the light at one time. By this, it is possible to transcribe a pattern, which corresponds to the pattern of the through-holes 6, into each of the photosensitive resin layers 2 formed on the respective surfaces of the substrate 1. Then, the pattern thus transcribed into each of the photosensitive resin layers 2 can be formed therein by performing development by use of a developer or the like. By above processes, pattern layers 3 are formed.

By exposing of the photosensitive resin layers 2 on the respective surfaces of the substrate 1 at one time in this way, it is possible to reduce the degree of misalignment between (i) a line (central axis) orthogonally passing through a center of the opening of a through-hole 6 on one surface of the substrate 1 and (ii) a line (central axis) orthogonally passing through a center of the opening of the through-hole 6 on the other surface of the substrate 1. As such, it is possible to form the through-hole 6 whose central axis is misaligned by a less degree. Thus, the processed substrate 1 can be increased in strength. Further, the through-hole 6, whose central axis is misaligned by the less degree, can allow preventing of a negative effect on each of (i) the removal step that is carried out in a case where the substrate 1 is used as a handling support plate, and (ii) reaching of a removal liquid to an adhesive agent in the removal step.

Means for exposing the photosensitive resin layers to light so that the pattern will be transcribed can be means using, for example, a low-pressure mercury lamp, a high-pressure mercury lamp, an ultrahigh-pressure mercury lamp, a metal halide lamp, an argon gas laser, or the like.

A method for performing development after completion of the exposure can be a method using an alkaline solution as a developer. Examples of the alkaline solution encompass alkaline solutions such as sodium hydrate, potassium hydrate, sodium carbonate, sodium silicate, sodium metasilicate, ammonia water, ethyl amine, n-propylamine, diethylamine, di-n-propylamine, triethylamine, methyldiethylamine, dimethylethanolamine, triethanolamine, tetramethylammoniumhydroxide, tetraethylammoniumhydroxide, pyrrole, piperidine, 1.8-diazabicyclo(5,4,0)-7-undecene, 1.5-diazabicyclo(4,3,0)-5-nonane, and the like. Also, it is possible to use, as a developer, any of the above alkaline solutions into which an appropriate amount of a water-soluble organic solvent and an interfacial active agent, such as methanol, ethanol, or the like, are added.

Development time typically ranges from 1 minute to 30 minutes, and a method for performing development can be any of poring, dipping, paddling, spray developing, and the like. Also, the development time can be 1.3 times longer than the time (break point) required for performing development to a photosensitive resin layer (i) formed on a substrate having the same size as the substrate 1 but (ii) having been subjected to no exposure. After completion of development, the substrate 1 can be washed with running water for 30 to 90 seconds, and then be post-baked.

Subsequently, the boring step is carried out. The boring operation forms through-holes 6 in the substrate 1, based on a pattern of the pattern layers 3 thus formed in the pattern formation step.

One example of the boring step is explained below, with reference to (d) through (g) of FIG. 1, but the present invention is not particularly limited to this. As shown in (d) of FIG. 1, it is preferable that the boring step first provide a protection layer 4 on an opposing surface of a boring surface. The protection layer 4 may be an adhesive layer that is made from a material such as rubber or urethane. As shown in (e) of FIG. 1, the boring step then bores the substrate 1 from the boring surface to approximately a middle of the substrate 1. In this case, boring of the substrate 1 can be performed by sandblasting, by use of a device such as a sandblasting grinder 5. Then, because the opposing surface of the boring surface is to be bored in the same way, it is preferable that the boring step include providing a protection layer 4 on the boring surface, as shown in (f) of FIG. 1. Thereafter, as shown in (g) of FIG. 1, in the boring step, the substrate is bored from the opposing surface of the boring surface into approximately the middle of the substrate 1 by a method such as sandblasting or the like. By the above processes, the through-hole 6 is formed.

Note that the method for forming the through-hole 6 can be sandblasting, acid etching, alkaline etching, drill processing, or the like.

It is preferable that the boring step form holes in the substrate 1 by conically boring the substrate 1 from each of the respective surfaces of the substrate 1. In a case where the boring step forms the holes in this way, it is possible to easily match sizes of the openings of the through-hole 6 in each surface. The through-hole 6 to be formed is not limited in shape. For example, the through-hole 6 can be formed in an hourglass shape or a columnar shape. Further, the openings of the through-hole 6 are not particularly limited in shape. For example, in a case where each of the openings is formed in a circular shape, the openings of the through-hole 6 has a diameter preferably ranging from 10 μm to 10000 μm and more preferably ranging from 100 μm to 500 μm. Moreover, the through-hole 6 is not particularly limited in aspect ratio (depth/width (diameter)), but it is preferable that the through-hole 6 be formed in such manner as to have an aspect ratio of 0.1 or greater but not greater than 10.

Because the boring step forms the through-hole 6 based on the pattern thus formed in the pattern formation step, the openings of the through-hole 6 will have the same sizes as the pattern. Therefore, if the patterns formed on the photosensitive rein layers 2 on the respective surfaces have the size matched to each other, it is possible to form the through-hole 6 having the openings whose sizes are matched between each surface.

In the method of the present invention for manufacturing the processed substrate, it is alternatively possible to perform the immersion step after removing the protective layer 4, as shown in (h) of FIG. 1, and punching out that necessary part of the substrate 1 in which through-holes 6 have been formed.

The immersing step immerses, into an acid, the substrate 1 in which the through-holes 6 have been formed. By this, it is possible to remove, from the through-holes 6, a burr or the like which has been formed in the boring step. Note that in the present specification, the "burr" indicates a peel or the like which is caused at time, for example, when processing such as boring of the substrate 1 or the like was performed.

The acid used herein is not particularly limited in kind, but can be, for example, a fluorinated acid or the like. Time during which the substrate 1 is immersed in the acid depends on, for example, a concentration of the fluorinated acid being used. It is preferable that the substrate 1 be immersed in the acid for 1 to 60 minutes. Immersing of the substrate 1 in this way makes it possible to suitably remove the burr or the like having been formed in the through-holes 6.

In the method of the present invention for manufacturing the processed substrate 1, the removal step can be carried out as shown in (j) of FIG. 1. The removal step removes, by use of a removal liquid or the like, the pattern layer 3 constituted by a remaining of the photosensitive resin layers 2. By performing of the removal step, it is possible to obtain the processed substrate 1 having the through-hole 6.

The removal step can be carried out before the immersion step, or can alternatively be carried out after the immersion step. It is preferable that the removal step be carried out after the immersion step is carried out. For example, in a case where the removal step is carried out after the immersion step, the removal step can be carried out after the substrate 1, which has been immersed in the acid in the immersion step, is taken out from the acid. Also, in a case where the removal step is carried out after the immersion step, the photosensitive resin layers are left on the surfaces of the substrate 1 during the immersion step, such that the substrate 1 can protected from the erosion by the acid during the immersion step. Therefore, it is not necessary to polish the surfaces of the substrate 1 after the immersion step. In other words, it is more preferable that the immersion step immerse, in the acid, the substrate 1 on which the photosensitive resin layer 2 are left. Further, it is more preferable that the removal step remove the photosensitive resin layers 2 after the immersing step whereby the substrate on which the photosensitive resin layers 2 are left is immersed in the acid.

The removal step is not limited as long as it is possible to remove the photosensitive resin layer 2 from the substrate 1. For example, it is possible to remove the photosensitive resin layers 2 by peeling the photosensitive resin layers 2 by use of a removal liquid. In this case, the removal liquid to be used can be, for example, (i) an inorganic alkaline solution such as sodium hydrate or potassium hydrate or (ii) an organic alkaline solution such as monoethanolamine or triethanolamine.

The present embodiment deals with an example in which the immersion step of immersing the substrate 1 in the acid after the boring step is provided, but no immersion step can be provided in the present invention. Further, in a case where the substrate 1 is a large substrate, it is possible to manufacture a plurality of the processed substrate 1 at the same time.

The present embodiment deals with an example in which one piece of the circular substrate having the through-holes 6 is manufactured from one piece of the substrate 1. Note however that, as in the case of, for example, Example 7 described later, a plurality of circular substrates each having through-holes can alternatively be manufactured from one piece of the substrate 1.

<3. Method 2 for Manufacturing Processed substrate>

Next, the following deals with another method of the present invention for manufacturing a processed substrate (hereinafter referred to as "method 2 of the present invention"), which other method is a method other than method 1 of the present invention.

The method 2 of the present invention differs from the method 1 of the present invention solely in that (i) photosensitive resin layers formed on respective surfaces of a substrate are not limited in film thickness, and (ii) a pattern formation step irradiates a front irradiation surface of the substrate with light which then passes through to a back surface of the substrate, and then reflects the light back to the back surface of the substrate, so as to irradiate the back surface of the substrate with the light thus reflected. Therefore, descriptions of the method 1 of the present invention explain the present embodiment except the difference mentioned above. Thus, the method 2 of the present invention is described as to solely the aspects differing from those of the method 1 of the present invention. In the following, descriptions are made with reference to FIG. 1, and members configured in a similar way to the case of the method 1 of the present invention are given the same numerals, and explanations thereof are omitted.

That is, the method of the present invention for manufacturing the processed substrate is a method for manufacturing a processed substrate including a light transmissive substrate having a plurality of through-holes, the method including:

(i) forming a pattern in each of photosensitive resin layers formed on respective surfaces of the light transmissive substrate, by exposing the each of photosensitive resin layers to light, which pattern corresponds to a pattern of the plurality of through-holes; and (ii) forming the plurality of through-holes, based on the pattern formed in the each of photosensitive resin layers by the step (i), wherein the step (i) includes: irradiating one of the respective surfaces of the light transmissive substrate with light which then passes through to the other one of the respective surfaces of the light transmissive substrate; and reflecting, back to the other one of the respective surfaces of the light transmissive substrate, the light which has now passed through the other one of the respective surfaces of the light transmissive substrate, so that the other one of the respective surfaces of the light transmissive substrate is irradiated with the light thus reflected.

One embodiment of the method 2 of the present invention is described below with reference to FIG. 1, but the present invention is not limited to the embodiment.

In the present embodiment, the pattern formation step as shown in (c) of FIG. 1 performs the exposure of the photosensitive resin layers 2 by: irradiating the front irradiation surface of the substrate 1 with light which then passes though to the back surface of the substrate 1; and reflecting back the light, which has now passed through the back surface of the substrate 1, to the back surface of the substrate 1, so as to irradiate/expose the back surface of the substrate 1 to/with the light thus reflected. By this, an amount of the light to which the back surface of the substrate 1 is exposed can be increased, and thus, it is possible that the photosensitive resin layers 2 formed on the respective surfaces of the substrate 1 be exposed to the approximately same amounts of the light. Therefore, sizes of the pattern formed on each surface of the substrate 1 are matched to each other. Thus, it is possible that subsequent boring step form a through-hole 6 whose openings in the respective surfaces of the substrate 1 are matched to each other in size.

It is preferable that a method for reflecting the light be realized by providing a reflection surface (which is not illustrated in the drawing) or the like (i) close to the back surface (opposing surface of the front irradiation surface irradiated with the light) of the substrate 1 and (ii) orthogonally with respect to an incidence direction. By this, it is possible that the reflection surface reflect, in a direction exact opposite to the incidence direction, the light having passed through the back surface of the substrate 1, so as to irradiate, with the light thus reflected, that part of the back surface of the substrate 1 which has been irradiated with incoming of the light.

The reflection surface is not particularly limited, but it is preferable that the reflection surface be a reflection surface which, for example, totally reflects incident light. Also, it is preferable that the reflection surface be provided close to the back surface of the substrate 1, but the present invention is not limited to this. For example, exposure may be carried out in such a manner that the substrate 1 on which the photosensitive resin layers 2 are formed is placed on the reflection surface, with the irradiation front surface facing upwardly to light with irradiation is carried out from above the front irradiation surface. Further, in the present embodiment, a reflection plate having a reflection surface or the like member can be used. An examples of the reflection plate encompasses a typical mirror such as a mirror glass or the like each of which is produced by evaporating metal such as an Si substrate having a mirror surface, aluminum, silver, or the like.

In the present embodiment, the photosensitive resin layers 2 which are formed in the respective surfaces of the substrate 1 are not particularly limited in film thickness. For example, the photosensitive resin layers 2 having the same film thicknesses can be formed on the respective surfaces of the substrate 1. Even in a case where the photosensitive resin layers 2 have the same film thicknesses are formed, the exposure in the above way makes it possible to form the pattern whose sizes on the respective surfaces of the substrate 1 are match to each other.

In the present embodiment, alternatively, the photosensitive resin layer 2 which is formed on one surface the substrate 1 can have a film thickness of 20 μm or thicker but 200 μm or thinner, and the photosensitive resin layer 2 which is formed in the other surface of the substrate 1 can have a film thickness of 40% or greater but not greater than 70% of the film thickness of the photosensitive resin layer 2 which is formed on the one surface of the substrate 1. With this configuration, the exposure of the photosensitive resin layers 2 formed on the respective surfaces s of the substrate 1 can be performed in such a manner that both the photosensitive resin layers 2 are irradiated with more equal amounts of light. As such, it can be further easier to form the pattern whose seizes on the respective surfaces of the substrate are matched to each other.

The present invention is not limited to the description of the embodiments above, but may be altered by a skilled person within the scope of the claims. An embodiment based on a proper combination of technical means disclosed in different embodiments is encompassed in the technical scope of the present invention. Entire contents of the literatures referred in the present specification are hereby incorporated by reference.

Embodiments of the present invention are explained in further detail with reference to Examples dealt with in the following descriptions. It is obvious that the present invention is not limited to Examples described below and can be embodied in various ways for details.

EXAMPLES

In each of Examples and Reference Examples, by the following method, a photosensitive resin layer was formed on each surface of a substrate, and a pattern was formed in each of the photosensitive resin layers thus formed on respective surfaces of the substrate.

First, a 6-inch glass substrate (1737 glass, t=0.7 mm) which served as a base material was preheated at 80° C. for five minutes in advance, and on each surface of the 6-inch glass substrate, a photosensitive resin composition (DFR (dry film resist)) was laminated, so as to form a photosensitive resin layer thereon. The photosensitive resin composition was BF 400 (manufactured by Tokyo Ohka Kogyo Co., Ltd.). Forming of the photosensitive resin layer was carried out with a laminator that was set to a roll temperature of 80° C., a pressure of 2.5 kgf/cm$^2$, and a speed of 1.0 m/min.

Next, a mask having a pattern corresponding to a pattern of the through-holes was placed on the photosensitive resin layer formed on one surfaces of the substrate. Then, by use of an ultra high pressure mercury lamp (parallel light, Hakuto Co., Ltd. exposure amount of 400 mJ/cm$^2$), the photosensitive resin layers on the respective surfaces of the substrate were irradiated with light from above the one surface of the substrate via the mask, so that a pattern was formed in each of the photosensitive resin layers on the respective surfaces of the substrate. The mask was a 6-inch mask (diameter of the mask: 150.5 mm, diameter of opening: 0.3 mm, pitch: 0.5 mm).

Then, development to the photosensitive resin layers on the respective surfaces of the substrate was carried out with a spray developer, by use of a development liquid (0.25% Na$_2$CO$_3$ aqueous solution) that was heated to 30° C. Subsequently, the photosensitive resin layers on the respective surfaces of the substrate were washed by water, and then dried at 80° C. for 10 minutes. By above processes, the pattern which corresponded to the pattern of the through-holes was formed in each of the photosensitive resin layers on the respective surfaces of the substrate.

Example 1

In Example 1, a photosensitive resin layer having a thickness of 100 μm was formed on one surface of a substrate, and a photosensitive resin layer having a thickness of 50 μm was formed on the other surface of the substrate. Subsequently, the substrate was exposed to light in a way as described earlier, so that a pattern was formed in each of the photosensitive resin layers on respective surfaces of the substrate.

The patterns thus formed in the respective photosensitive resin layers on the surfaces of the substrate were compared with each other in terms of diameter, and it was found that the pattern formed in the photosensitive resin layer on the one surface of the substrate had a diameter of 300 μm, and the pattern formed in the photosensitive resin layer on the other surface of the substrate had a diameter of 310 μm. Thus, a difference between the diameters of the respective patterns was 10 μm, and corresponded to 3.2% of a larger one (310 μm) of the diameters which was formed in the photosensitive resin layer on the other surface. Therefore, it was demonstrated that the patterns formed in the respective photosensitive resin layers on the surfaces of the substrate had sizes matched with each other.

Then, sandblasting was carried out at a blast pressure of 0.16 MPa and a processing speed of 50 mm/min for approximately 120 minutes, by use of silicon carbide (SiC) #600 (average grain diameter of 30 μm) as an abrasive agent in the sandblasting. This caused the substrate to have through-holes. Note that it was configured such that the number of the through-holes formed in the substrate would be approximately 120 holes/cm$^2$. Subsequently, the photosensitive resin layers were removed from the substrate by use of a removal liquid (product name "BF Stripper B", manufactured by Tokyo Ohka Kogyo Co. Ltd) that was heated to 30° C. By above processes, a processed substrate having the through-holes was manufactured.

Figure 2:
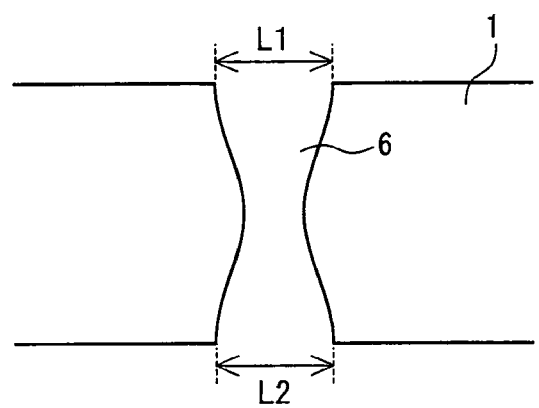
FIG. 2 is a cross sectional view of a through-hole in a processed substrate which is manufactured in Example 1.

By examination of the processed substrate thus manufactured, it was found that a glass substrate having a plurality of through-holes as shown in FIG. 2 was manufactured. FIG. 2 is a view schematically showing an area around a through-hole in the glass substrate thus manufactured in the present Example. In FIG. 2, a reference numeral 1 shows the glass substrate, and a reference numeral 6 shows the through-hole. According to FIG. 2, a diameter L1 was greater than a diameter L2, and a difference between the diameters L1 and L2 corresponded to 3.2% of a size of the diameter L1.

Example 2

In Example 2, photosensitive resin layers each having a thickness of 100 μm were formed in respective surfaces of a substrate. Irradiation and exposure of the photosensitive resin layers from above one surface of the substrate was carried out in such a manner that an Si substrate (mirror glass), which was provided below the other surface of the substrate, reflected back the light having passed though the second surface of the substrate, so that the second surface of the substrate was again irradiated with and exposed to the light. In this way, a pattern was formed in each of the photosensitive resin layers in the respective surfaces of the substrate.

The patterns thus formed in respective photosensitive resin layers in the surfaces of the substrate were compared with each other in terms of diameter, and it was found that the pattern formed in the photosensitive resin layer in the one surface of the substrate had a diameter of 300 μm, and the pattern formed in the photosensitive resin layer in the other surface of the substrate had a diameter of 310 μm. As such, a difference between the diameters of the patterns was 10 μm, and corresponded to 3.2% of the diameter (310 μm) of the pattern formed in the photosensitive resin layer on the other surface. Therefore, it was demonstrated that the patterns formed in the respective photosensitive resin layers in the surfaces of the substrate had seizes matched between each surface.

As described above, even in a case where the photosensitive resin layers having the same film thicknesses were formed in the respective surfaces of the substrate, it is possible to form, in the respective photosensitive resin layers in the surfaces of the substrate, the patterns whose sizes were matched between each surface, if exposure of the photosensitive resin layers was carried out at one time by reflecting the light.

Example 3

In Example 3, a photosensitive resin layer having a thickness of 100 μm was formed in one surface of a substrate, and a photosensitive resin layer having a thickness of 50 μm was formed in the other surface of the substrate. Note that irradiation and exposure of the photosensitive resin layers from above the one of the surfaces of the substrate were carried out in the same manner as in Example 2, that an Si substrate was provided below the other surface of the substrate. In this way, a pattern was formed in each of the photosensitive resin layers in the surfaces of the substrate.

The patterns thus formed in respective photosensitive resin layers were compared with each other in terms of diameter, and it was found that the pattern formed in the photosensitive resin layer in the one surface of the substrate had a diameter of 300 μm, and the pattern formed in the photosensitive resin layer in the other surface of the substrate had a diameter of 305 μm. Thus, a difference between the diameters of the respective patterns was 5 μm, and corresponded to 1.6% of larger one (305 μm) of the diameters which was formed in the photosensitive resin layer in the second other of the substrate.

Therefore, it was demonstrated that in a case where (i) the photosensitive resin layer formed on the other surface of the substrate had the film thickness thicker than the photosensitive resin layer formed on the one surface of the substrate, and (ii) exposure of the photosensitive resin layers was carried out at one time by reflecting light, it was possible to form, in the respective photosensitive resin layers on the surfaces of the substrate, the patterns whose sizes were further matched between each surface.

Reference Example 1

In Reference Example 1, a photosensitive resin layer having a thickness of 100 μm was formed on each surface of a substrate. Subsequently, the photosensitive resin layers were exposed to light without providing of an Si substrate, so that a pattern was formed in each of the photosensitive resin layers on the respective surfaces of the substrate.

The patterns thus formed in the respective photosensitive resin layers were compared with each other in terms of diameter, and it was found that the pattern formed in the photosensitive resin layer in one surface of the substrate had a film thickness of 298 μm, and the pattern formed in the photosensitive resin layer in the other surfaces of the substrate had a film thickness of 327 μm. Thus, a difference between the diameters of the respective patterns was 29 μm, and corresponded to 8.9% of a larger one (327 μm) of the diameters which was formed in the photosensitive resin layer in the other surface of the substrate.

Figure 3:
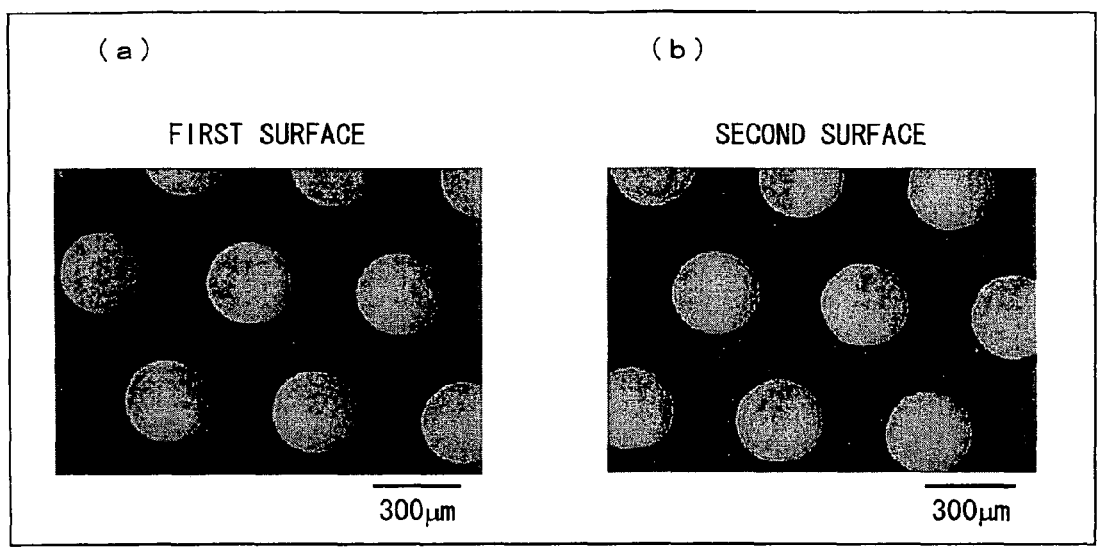
FIG. 3 is a view showing a pattern which is formed into one surface (front surface) and the other surface (back surface) of a substrate in Example 1.

The patterns formed in Reference Example 1 were shown in FIG. 3. FIG. 3 is a view showing the patterns formed in Reference Example 1, one of which was formed in the photosensitive resin layer in the one surface (first surface) of the substrate, and the other one of which was formed in the photosensitive resin layer in the other surface (second surface) of the substrate. (a) of FIG. 3 shows the pattern formed in the one surface of the substrate, and (b) of FIG. 3 shows the pattern formed in the other surface of the substrate. As shown in FIG. 3, the pattern formed in the other surface of the substrate was larger in diameter than the pattern formed in the one surface of the substrate.

Example 4

In Example 4, a photosensitive resin layer having a film thickness of 50 μm was formed in each surface of a substrate. Note that irradiation and exposure of the photosensitive resin layers from above one surface of the substrate were carried out in the same manner as in Example 2, that an Si substrate was provided below the other surface of the substrate. In this way, a pattern was formed in each of the photosensitive resin layers in the respective surfaces of the substrate.

The patterns thus formed in the respective photosensitive resin layers in the surfaces of the substrate were compared with each other in terms of diameter, and it was found that the pattern formed in the photosensitive resin layer in the one surface had a diameter of 300 μm, and the pattern formed in the photosensitive resin layer in the other surface had a diameter of 295 μm. As such, a difference between the diameters of the respective patterns was 5 μm, and corresponded to 1.7% of a larger one (300 μm) of the diameters which was formed in the photosensitive resin layer in the one surface of the substrate. Therefore, it was demonstrated that the patterns formed in the respective photosensitive resin layers had diameters which were matched between each surface.

Reference Example 2

In Reference Example 2, as in the case of Example 4, a photosensitive resin layer having a film thickness of 50 μm was formed in each surface of a substrate. Subsequently, the photosensitive resin layers formed in the respective surfaces of the substrate were exposed to light by use of no Si substrate, so that a pattern was formed in each of the photosensitive resin layers in the respective surfaces of the substrate.

The patterns thus formed in the respective photosensitive resin layers were compared with each other in terms of diameter, and it was found that the pattern formed in the photosensitive resin layer in one surface of the substrate had a diameter of 300 μm, and the pattern formed in the photosensitive resin layer in the other surface of the substrate had a diameter of 320 μm. Thus, a difference between the diameters of the respective patterns was 20 μm, and corresponded to 6.3% of a larger one (320 μm) of the diameters which was formed in the photosensitive resin layer in the one surface of the substrate.

Example 5

Next, an experiment was carried out, so as to study a relation between a film thickness of a photosensitive resin layer and a resistance of a photosensitive resin layer to sandblasting.

By a method described earlier, a photosensitive resin layer having a film thickness of 10 μm, 20 μm, 30 μm, 40 μm, 50 μm, or 100 μm was formed on each surface of a substrate, and a pattern was formed in each of the photosensitive resin layers thus formed on respective surfaces of the substrate. After this, sandblasting was carried out at a blast pressure of 2.0 kgf/cm² for approximately 10 minutes, by use of a silicon carbide (SiC) #600 (average grain diameter of 30 μm) as an abrasive agent in the sandblasting. Then, each of the photosensitive resin layers was examined as to its film condition. With respect to the film condition of each photosensitive resin layer, good (o) indicates that a film of the photosensitive resin layer was left without any breakage, relatively good (Δ) indicates that a film of the photosensitive resin layer was partially broken, and bad (x) indicates that no film of the photosensitive resin layer was left. Table 1 shows, for each film thickness of the photosensitive resin layer, a result of the film condition of each photosensitive resin layer having been subjected to sandblasting.

TABLE 1

| Film Thickness (μm) | Film Condition of After being Subjected to Sandblasting |
|---|---|
| 10 | x |
| 20 | Δ |
| 30 | o |
| 40 | o |
| 50 | o |
| 100 | o |

The results above confirmed that the photosensitive resin layer having the film thickness of 20 μm or thicker can be satisfactory in resistance to the sandblasting.

Example 6

Next, an experiment was carried out, so as to study a relation between a film thickness of a photosensitive resin layer and a resolution of a pattern.

A photosensitive resin layer having a film thickness of 50 μm, 100 μm, 150 μm, 200 μm, 250 μm, or 300 μm was formed on each surface of a substrate by use of a method described earlier, and the photosensitive resin layers thus formed in respective surfaces of the substrate were exposed to light in the way as described earlier, so that a pattern was formed in each of the photosensitive resin layers on the respective surfaces of the substrate. After being formed, the pattern was examined as to resolution. With respect to the resolution of the pattern, good (o) indicates that the pattern was resolved, poor (x) indicates that the pattern was not resolved. Table 2 shows, for each film thickness of the photosensitive resin layer, a result of a resolution of the pattern.

TABLE 2

| Film Thickness (μm) | Resolution |
| --- | --- |
| 50 | o |
| 100 | o |
| 150 | o |
| 200 | o |
| 250 | x |
| 300 | x |

The results confirmed that the photosensitive resin layer having the film thickness of 200 μm or thinner provided good resolution of the pattern.

Example 7

Figure 4:
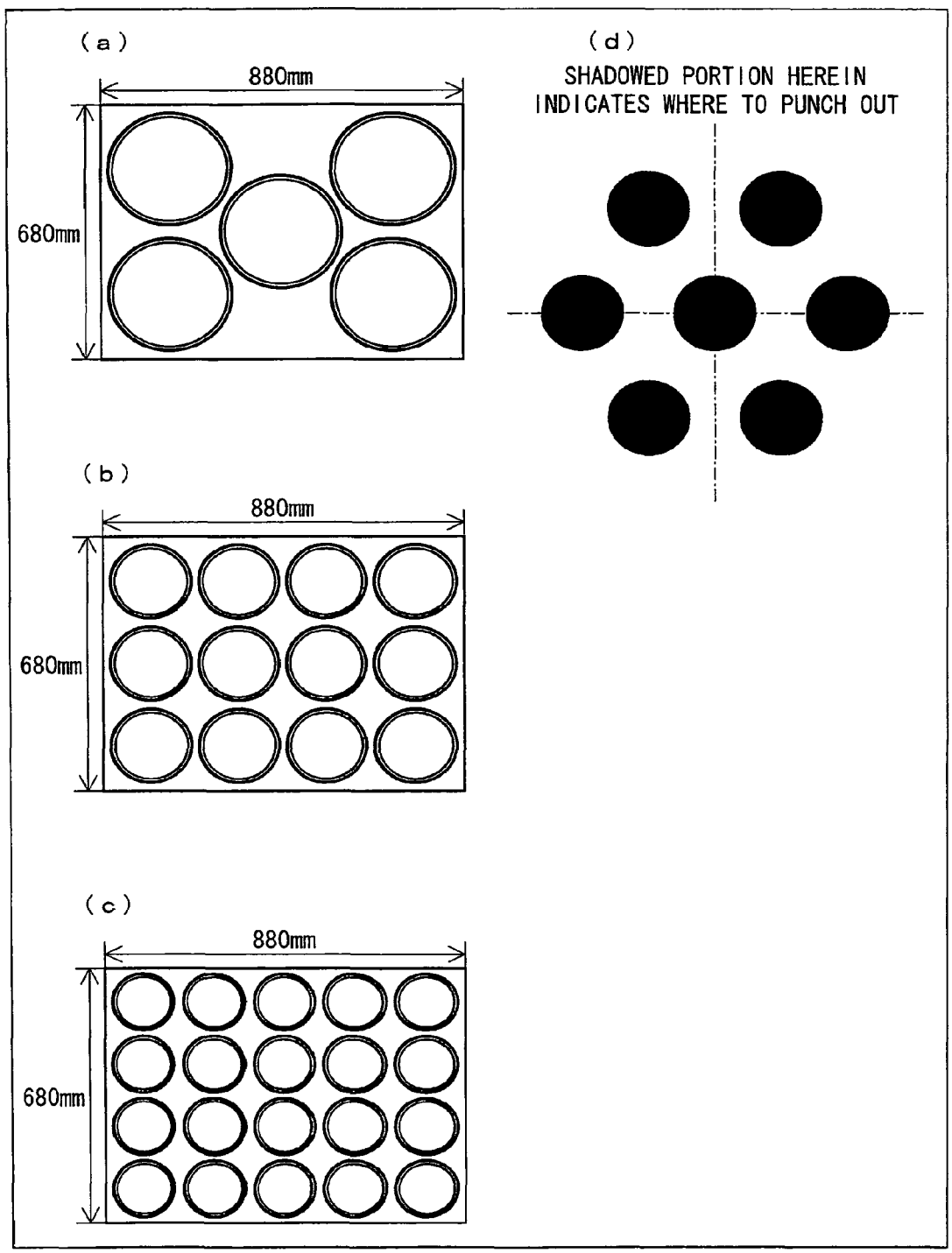
FIG. 4 is a view schematically showing area allocation of a large glass substrate for circular glass substrates.

In the present Example, circular glass substrates each having through-holes were manufactured from a large glass substrate (680 mm×880 mm) which served as a base material. FIG. 4 is a view schematically showing area allocation of a large glass substrate for circular glass substrates. In the present Example, circular glass substrates of three different seizes were manufactured. Five pieces of circular glass with a diameter of 301 mm were defined in a large glass substrate as shown in (a) of FIG. 4. Also, 12 pieces of circular substrates with a diameter of 201 mm were defined in a large glass substrate as shown in (b) of FIG. 4. Further, 20 pieces of circular glass substrates with a diameter of 151 mm were defined in a large glass substrate as shown in (c) of FIG. 4.

First, the following deals with a case in which the five pieces of the circular substrates were manufactured. The large glass substrate was preheated at 80° C. for five minutes in advance, and on each surface of the large glass substrate, a photosensitive resin composition (DFR) was laminated so as to form a photosensitive resin layer thereon. The photosensitive resin composition was BF 410 (manufactured by Tokyo Ohka Kogyo Co., Ltd.). The laminating of the photosensitive resin composition was carried out with a laminator that was set to a roll temperature of 80° C., a pressure of 2.5 kgf/cm², and a speed of 1.0 m/min. Then, the photosensitive resin layers on the respective surfaces of the substrate were irradiated with light (i) from above one of the surfaces via a mask (inner diameter of 0.3 mm, pitch of 0.5 mm) having a pattern corresponding to a pattern of the through-holes, and (ii) by use of an EXM-1201 manufactured by ORC Manufacturing Co., Ltd, which was set to an exposure amount of 800 mJ/cm² (exposure amount of 350 nm when converted into i-line). By this, each of the photosensitive resin layers in the respective surfaces of the substrate was exposed to pattern exposure of the mask's pattern. (d) of FIG. 4 shows a pattern of the through-holes.

Subsequently, by use of a developer (0.25% $Na_2CO_3$ aqueous solution) heated to 30° C., development of the pattern thus formed in each of the photosensitive resin layers was carried out with a spray developing machine for 95 seconds (1.3 times longer than a breakpoint which is a referential time after which development of a photosensitive resin layer (i) formed on a substrate having a same size as the substrate (ii) but not having been subjected to any exposure was completed was completed). Then, after being washed by water, the photosensitive resin layers on the respective surfaces of the substrate were dried at 100° C. for 10 minutes. By above processes, the pattern corresponding to the pattern of the through-holes was formed in each of the photosensitive resin layers on the respective surfaces of the substrate.

Subsequently, the circular glass substrates and the through-holes were punched out at the same time by sandblasting. That is, by the sandblasting, the through-holes were formed concurrently with formation of the circular glass substrates (no processing was required to be carried out with respect to that hole in the pattern of the through-holes which made contact to a boarder of any circular glass substrate). Note that the above processing was carried out by the same operation and in the same conditions as in Example 1 except for the operation and the conditions specifically described herein. Specifically, by sandblasting, that annular region around a circular glass substrate which had a diameter of φ 301 mm to φ 307 mm and a width of 3 mm was punched out so that an area with a diameter of φ 301 mm became a use area, at the same time as the through-holes were formed into the use area.

The through-holes in the circular glass substrate having been subjected to lithography had openings in a first surface with a diameter of 300 μm and openings in a second surface with a diameter of 305 μm. On the other hand, the through-holes in the circular glass substrate having been subjected to the sandblasting had openings in the first surface with a diameter of 320 μm and openings in the second surface with a diameter of 325 μm. (i) A central axis passing through a center of an opening of a through-hole in the first surface and (ii) a central axis passing through a center of an opening of the through-hole in the second surface were not misaligned relative to each other at all.

Obtaining of 12 pieces of or 20 pieces of processed substrates can be carried out in the same way as in the case of obtaining of 5 pieces of the processed substrates, by use of the same means as used in the case of obtaining of 5 pieces of the processed substrates.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

A processed substrate of the present invention can be easily manufactured with high efficiency, and the processed substrate of the present invention has through-holes each having, in respective surfaces of the processed substrate, openings matched between each surface of the processed substrate. Therefore, the processed substrate of the present invention can be used in manufacturing of a semiconductor chip which is used in a downsized tool in a device such as a mobile communication device.

The invention claimed is:

1. A method for manufacturing a processed substrate, the method comprising:
   (i) forming a pattern in a first photosensitive resin layer and a second photosensitive resin layer, the first photosensitive resin layer being disposed on a first surface of a light transmissive substrate, and the second photosensitive resin layer being disposed on a second surface of the light transmissive substrate, the pattern being formed in each of the first and second photosensitive resin layers by selectively exposing the first and second photosensitive resin layers to light, and the pattern corresponding to a pattern of a plurality of through-holes to be formed; and
   (ii) forming the plurality of through-holes by boring the light transmissive substrate, based on the pattern formed in each of the first and second photosensitive resin layers,
   wherein said forming the pattern includes:
   selectively exposing each of the first and second photosensitive resin layers to light, by irradiating the first surface of the light transmissive substrate with the light which then passes through to the second surface of the light transmissive substrate, and
   performing development of the first and second photosensitive resin layers,
   wherein the first photosensitive resin layer disposed on the first surface of the light transmissive substrate has a thickness of at least 20 μm but not greater than 200 μm, and the second photosensitive resin layer disposed on the second surface of the light transmissive substrate has a thickness of at least 40% but not greater than 70% of the thickness of the first photosensitive resin layer disposed on the first surface of the light transmissive substrate.

2. The method as set forth in claim 1, wherein:
   said forming the plurality of through-holes includes conically boring the light transmissive substrate from each of the first and second surfaces of the light transmissive substrate such that a first one of the plurality of through-holes adjoins a second one of the plurality of through-holes, and a combined length of the first one of the plurality of through-holes and the second one of the plurality of through-holes extends from the first surface of the light transmissive surface to the second surface of the light transmissive surface.

3. The method as set forth in claim 1, wherein:
   the light transmissive substrate is made from glass; and
   the method further comprises, after said forming the plurality of through-holes,
   (iii) immersing the light transmissive substrate in an acid, wherein the first and second photosensitive resin layers are left on the light transmissive substrate during said immersing, such that the light transmissive substrate is protected from erosion by the acid.

4. The method as set forth in claim 3, the method further comprising, after said immersing the light transmissive substrate in the acid,
   (iv) removing the first and second photosensitive resin layers from the light transmissive substrate.

5. The method as set forth in claim 1, wherein the first surface is a top surface and the second surface is a bottom surface.

6. The method as set forth in claim 1, wherein the first surface is a bottom surface and the second surface is a top surface.

7. The method as set forth in claim 1, wherein:
   the pattern is formed by photolithography.

8. The method as set forth in claim 7, wherein:
   the plurality of through-holes is formed by one of sandblasting, acid etching, alkaline etching, and drill processing.

9. The method as set forth in claim 1, wherein:
   the plurality of through-holes is formed by one of sandblasting, acid etching, alkaline etching, and drill processing.

10. A method for manufacturing a processed substrate, the method comprising:
    (i) forming a pattern in a first photosensitive resin layer and a second photosensitive resin layer, the first photosensitive resin layer being disposed on a first surface of a light transmissive substrate, and the second photosensitive resin layer being disposed on a second surface of the light transmissive substrate, the pattern being formed in each of the first and second photosensitive resin layers by selectively exposing the first and second photosensitive resin layers to light, and the pattern corresponding to a pattern of a plurality of through-holes to be formed; and
    (ii) forming the plurality of through-holes by boring the light transmissive substrate, based on the pattern formed in the each of the first and second photosensitive resin layers,
    wherein said forming the pattern includes:
    irradiating the first surface of the light transmissive substrate with light which then passes through to the second surface of the light transmissive substrate; and reflecting, back to the first surface of the light transmissive substrate, the light which has now passed through the second surface of the light transmissive substrate, so that the first surface of the light transmissive substrate is irradiated with the light thus reflected; and
    performing development of the first and second photosensitive resin layers.

11. The method as set forth in claim 10, wherein:
    the first photosensitive resin layer disposed on the first surface of the light transmissive substrate has a thickness of at least 20 μm but not greater than 200 μm, and the second photosensitive resin layer disposed on the second surface of the light transmissive substrate has a thickness of at least 40% but not greater than 70% of the thickness of the first photosensitive resin layer disposed on the first surface of the light transmissive substrate.

12. The method as set forth in claim 10, wherein said forming the plurality of through-holes includes conically boring the light transmissive substrate from each of the first and second surfaces of the light transmissive substrate such that a first one of the plurality of through-holes adjoins a second one of the plurality of through-holes, and a combined length of the first one of the plurality of through-holes and the second one of the plurality of through-holes extends from the first surface of the light transmissive surface to the second surface of the light transmissive surface.

13. The method as set forth in claim 10, wherein:
    the light transmissive substrate is made from glass; and
    the method further comprises, after said forming the plurality of through-holes,
    (iii) immersing the light transmissive substrate in an acid, wherein the first and second photosensitive resin layers are left on the light transmissive substrate during said immersing, such that the light transmissive substrate is protected from erosion by the acid.

14. The method as set forth in claim 13, the method further comprising, after said immersing the light transmissive substrate in the acid,
- (iv) removing the first and second photosensitive resin layers from the light transmissive substrate.

15. The method as set forth in claim 10, wherein the first surface is a top surface and the second surface is a bottom surface.

16. The method as set forth in claim 10, wherein the first surface is a bottom surface and the second surface is a top surface.

17. The method as set forth in claim 10, wherein:
the pattern is formed by photolithography.

18. The method as set forth in claim 17, wherein:
the plurality of through-holes is formed by one of sandblasting, acid etching, alkaline etching, and drill processing.

19. The method as set forth in claim 10, wherein:
the plurality of through-holes is formed by one of sandblasting, acid etching, alkaline etching, and drill processing.

* * * * *